United States Patent
Mori et al.

(10) Patent No.: US 10,246,776 B2
(45) Date of Patent: Apr. 2, 2019

(54) LAYER-FORMING DEVICE AND LAYER-FORMING METHOD

(71) Applicant: Mitsui Engineering & Shipbuilding Co., Ltd., Chuo-ku, Tokyo (JP)

(72) Inventors: Yasunari Mori, Tamano (JP); Naomasa Miyatake, Tamano (JP); Nozomu Hattori, Tamano (JP)

(73) Assignee: MITSUI E&S MACHINERY CO., LTD, Tokyo (JP)

( * ) Notice: Subject to any disclaimer, the term of this patent is extended or adjusted under 35 U.S.C. 154(b) by 596 days.

(21) Appl. No.: 14/770,782

(22) PCT Filed: Feb. 21, 2014

(86) PCT No.: PCT/JP2014/054176
§ 371 (c)(1),
(2) Date: Aug. 26, 2015

(87) PCT Pub. No.: WO2014/132891
PCT Pub. Date: Sep. 4, 2014

(65) Prior Publication Data
US 2016/0002785 A1 Jan. 7, 2016

(30) Foreign Application Priority Data
Feb. 28, 2013 (JP) .................................. 2013-039726

(51) Int. Cl.
| | | |
|---|---|---|
| C23C 16/00 | (2006.01) | |
| C23F 1/00 | (2006.01) | |
| H01L 21/306 | (2006.01) | |
| C23C 16/455 | (2006.01) | |
| H01J 37/32 | (2006.01) | |
| C23C 16/54 | (2006.01) | |

(52) U.S. Cl.
CPC .. *C23C 16/45544* (2013.01); *C23C 16/45536* (2013.01); *C23C 16/545* (2013.01);
(Continued)

(58) Field of Classification Search
USPC .............. 118/715, 718, 719, 723 E, 723 ER; 156/345, 33, 345.34, 345.43–345.47
See application file for complete search history.

(56) References Cited

U.S. PATENT DOCUMENTS 4,920,917 A * 5/1990 Nakatani ................. C23C 16/52
118/718
5,545,258 A * 8/1996 Katayama ......... H01J 37/32192
118/723 E
(Continued)

FOREIGN PATENT DOCUMENTS

| JP | 2000-345349 A | 12/2000 |
| JP | 2009-052063 A | 3/2009 |
(Continued)

OTHER PUBLICATIONS

International Search Report of the corresponding International Application No. PCT/JP2014/054176, dated May 20, 2015.

*Primary Examiner* — Rakesh K Dhingra
(74) *Attorney, Agent, or Firm* — Global IP Counselors, LLP

(57) ABSTRACT

A layer-forming device that enables highly efficient layer formation and has a simplified configuration includes: a substrate feeding mechanism; a plasma-generating electrode; a space-partitioning wall; and a plurality of injectors. The plasma-generating electrode faces towards a feeding pathway of the substrate, and generates plasma using a reactive gas upon a supply of electric power. The space-partitioning wall is disposed between the feeding pathway and the plasma-generating electrode. A plurality of slit-shaped through-holes, through which radicals, ions generated from the plasma, or a portion of the plasma can pass, are formed at predetermined intervals in the space-partitioning wall. The plurality of injectors are sandwiched between the space-partitioning wall and the feeding pathway, such that
(Continued)

each of the injectors is sandwiched between two adjacent through-holes from both sides of the two through-holes in the feeding direction, and the layer-forming gas is supplied toward the substrate through a layer-forming gas supply port.

18 Claims, 4 Drawing Sheets

(52) U.S. Cl.
CPC .. *H01J 37/32091* (2013.01); *H01J 37/32422* (2013.01); *H01J 37/32761* (2013.01); *C03C 2218/153* (2013.01)

(56) References Cited

U.S. PATENT DOCUMENTS

| | | | | |
|---|---|---|---|---|
| 6,200,389 | B1* | 3/2001 | Miller | C03C 17/002 118/715 |
| 2001/0003014 | A1 | 6/2001 | Yuda | |
| 2001/0042512 | A1 | 11/2001 | Xu et al. | |
| 2002/0000202 | A1 | 1/2002 | Yuda et al. | |
| 2007/0224348 | A1 | 9/2007 | Dickey et al. | |
| 2007/0275339 | A1* | 11/2007 | Cress | C23C 16/45565 432/247 |
| 2008/0081374 | A1 | 4/2008 | Takatsu et al. | |
| 2009/0291211 | A1* | 11/2009 | Ryu | C23C 16/45551 427/255.23 |
| 2009/0304924 | A1* | 12/2009 | Gadgil | C23C 16/4412 427/255.5 |
| 2010/0206846 | A1 | 8/2010 | Nishimura et al. | |
| 2011/0174775 | A1* | 7/2011 | Umeoka | H01J 37/3244 216/58 |
| 2011/0308735 | A1* | 12/2011 | Takeuchi | C23C 16/24 156/345.44 |

FOREIGN PATENT DOCUMENTS

| | | |
|---|---|---|
| JP | 2010-192197 A | 9/2010 |
| JP | 2011-501779 A | 1/2011 |
| JP | 2011-137208 A | 7/2011 |

* cited by examiner

LAYER-FORMING DEVICE AND LAYER-FORMING METHOD

CROSS-REFERENCE TO RELATED APPLICATIONS

This U.S. National stage application claims priority under 35 U.S.C. § 119(a) to Japanese Patent Application No. 2013-039726, filed in Japan on Feb. 28, 2013, the entire contents of Japanese Patent Application No. 2013-039726 are hereby incorporated herein by reference.

BACKGROUND

Field of the Invention

A present disclosure relates to a layer-forming device that forms a thin layer in atomic layer unit using a layer-forming gas and a reactive gas, and a layer-forming method.

Background Information

Recently, a layer-forming method according to Atomic Layer Deposition (ALD) is known, in which a thin layer is formed in atomic layer unit. In ALD, a thin layer configuration having a plurality of stacked layers in atomic layer unit are formed by alternatively supplying a layer-forming gas and a reactive gas as a precursor gases. Because a thin layer obtained by the ALD is able to produce an extremely thin layer thickness of approximately 0.1 nm, the ALD may be effectively utilized as a highly precise layer-forming process in the production of various devices.

For example, a layer-forming device is known that allows for production costs to be reduced and for flexibility to be enhanced during a layer-forming process (see, JP-A 2011-137208).

The abovementioned layer-forming device includes: a feeding mechanism that feeds a base material as a body on which a layer is formed, and the feeding mechanism includes a plurality of roller members; and a plurality of head parts that are disposed so as to face the roller member, and plurality of head parts act as a gas source capable of locally outputting a precursor gas for performing atomic layer deposition to the base material. In addition, each head part is constructed to allow a separate output of a plurality of types of precursor gases.

SUMMARY

A layer-forming device employs a flexible substrate, film-shaped substrate, or sheet-shaped substrate. The layer-forming device alternately supplies different gases to the substrate by controlling the substrate to pass by a plurality of head parts while feeding the substrate via a guide roller.

The layer-forming device forms a thin layer in atomic layer unit by alternately supplying different gases to the substrate, and by reacting a supplied gas and a layer of a layer-forming component formed on the substrate of another gas that has been supplied. However, the reaction is temperature dependent. Therefore, it is necessary to increase a temperature of the substrate in order to speed up the reaction. But, in a case where using a flexible resin-type film as the substrate, the substrate can only be raised from a heat-resistant temperature thereof up to 80 to 100° C. (only a low-temperature process may be performed).

On the other hand, a layer-forming process is known in ALD using plasma (hereinafter referred to as "plasma ALD") that allows for layer-forming at a low substrate temperature (80 to 100° C.) to the same degree as layer-forming at a high substrate temperature (300 to 400° C.).

However, in plasma ALD device that performs layer deposition on the substrate during feeding, a highly reactive radical atom, radical molecule, or ion generated from plasma is employed. Accordingly, wherever possible, a combination of any layer-forming gas with the reactive radical atom, the radical molecule, or the ion in a space should be avoided.

In addition, nothing is known at the present time with respect to a plasma ALD device that forms layer on a fed substrate that allows for layer-forming to be more efficiently performed, or a device configuration that is capable of achieving simplified plasma ALD configuration.

An objective of the present disclosure is to provide a layer-forming device forming layer on the substrate during feeding using plasma ALD that allows for layer-forming to be more efficiently conducted, and also to provide a layer-forming device forming layer on the substrate during feeding using plasma ALD that may achieve a simplified plasma ALD configuration and a layer-forming method using the layer-forming device.

In an embodiment of the present disclosure, a layer-forming device is disclosed that forms a thin layer in atomic layer unit using a layer-forming gas and a reactive gas. The layer-forming device includes:

a layer-forming container;

a feeding mechanism configured to feed a substrate for layer-forming inside the layer-forming container;

a plasma-generating electrode disposed to face a feeding pathway of the substrate during feeding, the plasma-generating electrode configured to receive a supply of electric power to generate plasma using a reactive gas inside the layer-forming container;

a space-partitioning wall disposed between the feeding pathway of the substrate and the plasma-generating electrode, the space-partitioning wall forming a plasma-generating space between the plasma-generating electrode and the space-partitioning wall, the space-partitioning wall having a plurality of slit-shaped through holes for communicating the plasma-generating space and a space between the feeding pathway of the substrate and the space-partitioning wall, the through holes being disposed at intervals along a feeding direction of the substrate; and gas injectors, each of the gas injectors being disposed between the space-partitioning wall and the feeding pathway, and being sandwiched from both sides of a feeding direction by adjacent through holes of the plurality of through holes, each of the gas injectors configured to supply the layer-forming gas from a layer-forming gas supply opening thereof to the substrate.

Preferably, an opposing surface of the space-partitioning wall that faces the plasma-generating electrode is composed of a grounding electrode.

Each of the gas injectors is preferably disposed on a surface of the space-partitioning wall opposite to an opposing surface of the space-partitioning wall that faces the plasma-generating electrode.

A gas supply hole for supplying the reactive gas inside the plasma-generating space is preferably disposed in a side wall of the layer-forming container.

In the device, a dummy injector configured not to supply the layer-forming gas to the substrate is preferably disposed further on a downstream side of the feeding direction than a furthest downstream gas injector positioned at a furthest downstream side of the feeding direction of the substrate, and the dummy injector is disposed so as to be spaced at an interval away from the furthest downstream gas injector, such that a furthest downstream through hole positioned on a furthest downstream side of the feeding direction of the plurality of through holes is positioned between the dummy injector and the furthest downstream injector.

The feeding mechanism preferably includes a pair of rotary rollers, the substrate is a long flexible film, and the film is wound onto one rotary roller before feeding.

Each rotary roller is preferably configured to rotate in different directions.

In an embodiment of the present disclosure, a layer-forming method is disclosed that employs a layer-forming device. In such a case, the layer-forming device includes:

a layer-forming container, a feeding mechanism configured to feed a substrate for layer-forming inside the layer-forming container, a plasma-generating electrode disposed to face a feeding pathway of the substrate during feeding, the plasma-generating electrode configured to receive a supply of electric power to generate plasma using a reactive gas inside the layer-forming container, a space-partitioning wall disposed between the feeding pathway of the substrate and the plasma-generating electrode, the space-partitioning wall forming a plasma-generating space between the plasma-generating electrode and the space-partitioning wall, the space-partitioning wall having a plurality of slit-shaped through holes for communicating the plasma-generating space and a space between the feeding pathway of the substrate and the space-partitioning wall disposed at intervals along a feeding direction of the substrate, and gas injectors, each of the gas injectors being disposed between the space-partitioning wall and the feeding pathway, and being sandwiched from both sides of a feeding direction by adjacent through holes of the plurality of through holes, each of the gas injectors configured to supply the layer-forming gas from a layer-forming gas supply opening thereof to the substrate, the substrate being a film from a roll of film, the layer deposition method comprising:

a first step of producing a roll of processed film by unwinding the film from the roll of film, then feeding the film for layer-forming process, and winding the film processed during feeding; and a second step of making a new roll of processed film by again unwinding the processed film from the roll of processed film, then feeding the processed film in order to increase a layer thickness on the processed film, and winding the processed film, wherein a target layer thickness is obtained by repeating the second step.

In the first step and the second step, a plurality of sets of sub-processes are preferably conducted to the film, each set of sub-processes including:

a layer-forming component deposition, in which a layer of a layer-forming component is formed on the film by supplying the layer-forming gas from the gas injector to the film, and a reaction, in which the layer of the layer-forming component formed on the film is reacted with the plasma or a radical generated from the plasma supplied to the film, and wherein a final sub-process before winding the film is the reaction.

A layer-forming device and a layer-forming method allow for layer-forming to be more efficiently conducted, and for a simplified ALD configuration to be achieved.

DESCRIPTION OF EMBODIMENTS

Hereinafter, a layer-forming device of a present disclosure will be described in detail.

Figure 1:
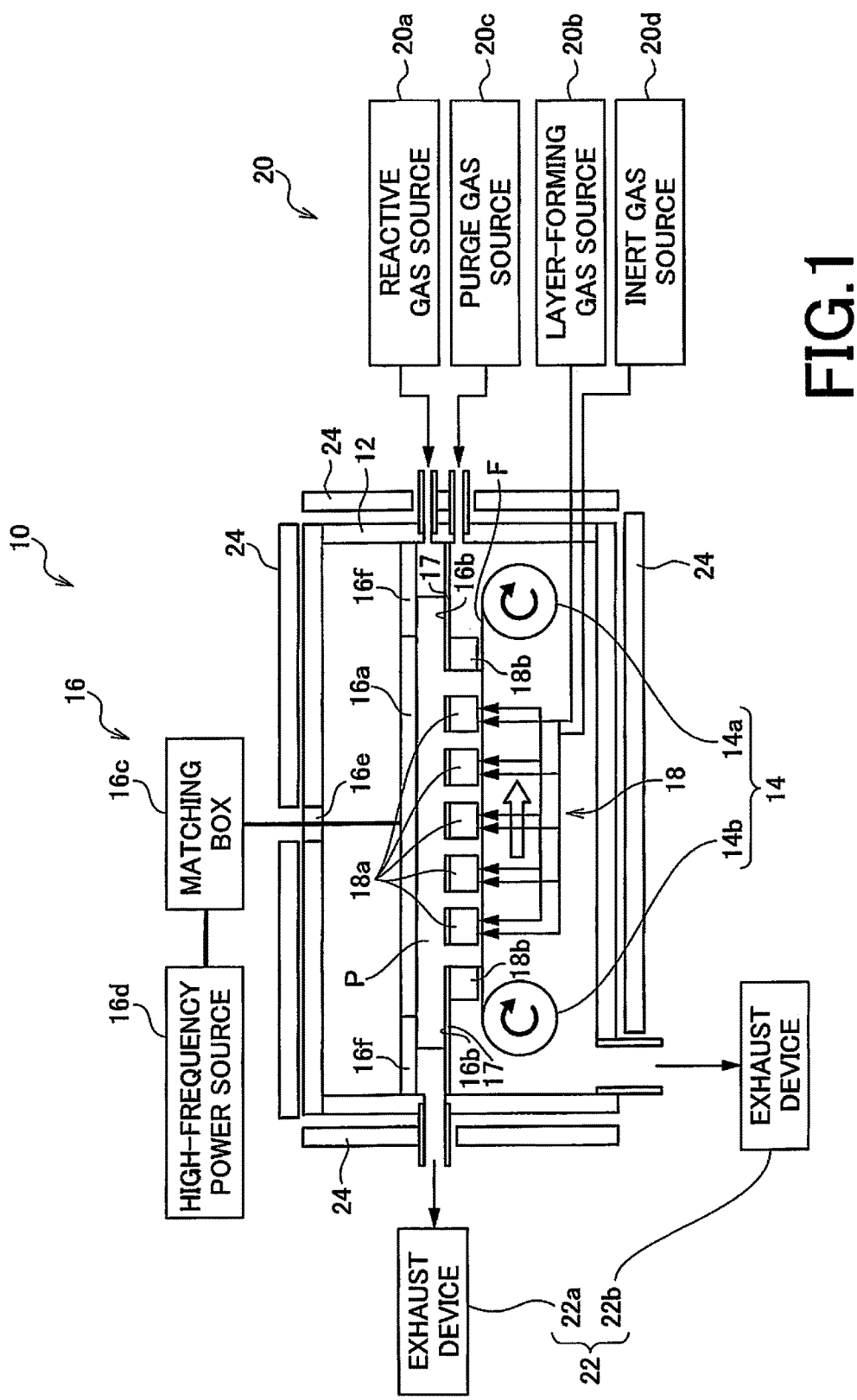
FIG. 1 illustrates a schematic drawing of a layer-forming device of a present embodiment.

FIG. 1 illustrates a schematic drawing of a layer-forming device of a present embodiment. A layer-forming device 10 is a device that forms a thin layer in atomic layer unit using a layer-forming gas and a reactive gas. The layer-forming device 10 includes: a layer-forming container 12; a feeding mechanism 14; a plasma-generating unit 16; a space-partitioning wall 17; an injector unit 18; a gas supply unit 20; and an exhaust unit 22. The layer-forming device 10 has the below-mentioned configuration. The feeding mechanism 14 feeds a substrate for layer-forming inside the layer-forming container 12. The plasma-generating unit 16 includes plasma-generating electrode. The plasma-generating electrode in the layer-forming container 12 is disposed so as to face a feeding pathway of the substrate during feeding. The plasma-generating electrode generate plasma by using a reactive gas inside a layer-forming space as a result of a supply of electric power received. The space-partitioning wall 17 in the layer-forming container 12 is disposed between the feeding pathway of the substrate and the plasma-generating electrode, and the space-partitioning wall 17 forms a plasma-generating space between plasma-generating electrode and the space-partitioning wall 17. The space-partitioning wall has a plurality of slit-shaped through holes, which communicate the plasma generating space and a space between the feeding pathway of the substrate and the space-partitioning wall, disposed at intervals along a feeding direction of the substrate. A radical or an ion generated from the plasma or a part of the plasma may pass through the though holes.

The injector unit 18 includes a plurality of gas injectors (hereinafter, simply referred to as "injector"). Each injector outputs a layer-forming gas from a layer-forming gas supply opening, and supplies the layer-forming gas to the substrate. Each injector is disposed between the space-partitioning wall 17 and the feeding pathway, and sandwiched by adjacent through holes of the though holes in the space-partitioning wall 17 from both sides of the feeding direction of the substrate.

Hereinafter, various configurations of the layer-forming device 10 will be described in detail. The present embodiment describes an extremely thin glass plate or resin film as the substrate for layer-formation. The present embodiment employs a long flexible substrate that can be wound into a rolled shape as a substrate for layer-formation. However, the substrate employed in the present embodiment is not limited to a flexible substrate. For example, a one-piece unflexible plate-shaped substrate may be used as the substrate for layer-formation.

As illustrated in FIG. 1, the feeding mechanism 14, a plasma-generating electrode 16a associated with the plasma-generating unit 16, and the injector unit 18, are mainly disposed within the layer-forming space in the layer-forming container 12. The layer-forming container 12 is for layer-formation on the substrate inside the layer-forming space by maintaining the layer-forming space at a predetermined pressure or at a reduced pressure. A thermal heater 24 for setting ambient atmosphere inside the layer-forming space to a desired temperature during the layer-forming is disposed in each wall surface of an outer periphery of the container 12.

The substrate for layer-formation that is fed by the feeding mechanism 14 is a flexible film F from a roll of film (a roll wound onto a rotary roller 14a or a rotary roller 14b). The feeding mechanism 14 includes the rotary rollers 14a, 14b and feeds the film F inside the layer-forming container 12. The rotary rollers 14a, 14b are connected to a drive motor (not shown). The rotary rollers 14a, 14b are configured to rotate by rotation of the drive motor. The rotational direction of the drive motor can be selected. The film F is wound onto the rotary rollers 14a, 14b before being fed. The film F is formed in a roll shape. In the feeding mechanism 14, one of the rotary rollers 14a, 14b operates as a winding roller and the other one of the rotary rollers 14a, 14b as a feeding roller. In other words, the film F is unwound from being wound in a roll (rotary roller 14b) by the rotation of the rotary roller 14a, 14b, and the film F is wound onto the rotary roller 14a. At such a time, the unwound film F is fed in one direction for layer-forming process, then the film F subjected to layer-forming process during feeding is wound onto the rotary roller 14a, thereby producing a roll of processed film. FIG. 1 illustrates the film F being fed from the rotary roller 14b to rotary roller 14a, and the film F being wound by the rotary roller 14a.

In the present embodiment, it is preferable that the layer-formation on the film F is repeated in order to thicken a layer thickness of a formed thin layer on the film F. At such a time, it is preferable that the feeding mechanism 14 feeds from the rotary roller 14a towards the rotary roller 14b, i.e., in a direction opposing the feeding direction during the previous layer-forming process, by again unwinding the roll of processed film obtained by winding of the processed film F onto the rotary roller 14a after layer-forming process. During feeding, the film F has the layer thickened. The rotary roller 14b winds the processed film F to make a new roll of processed film. Next, the feeding mechanism 14 feeds the film F from the rotary roller 14b towards the rotary roller 14a, i.e., in a direction opposing the feeding direction during the previous layer-forming process, in order to further thicken the layer thickness. During feeding, a layer thickness become thickened. The rotary roller 14a winds the processed film F to make a new roll of processed film. Accordingly, it is preferable that a target layer thickness is obtained on film F by thickening the layer thickness of the thin layer while repeating the feeding of the film F towards different directions. In other words, it is preferable that each of the rotary rollers 14a, 14b has a configuration such that each can rotate in different directions. Therefore, the feeding direction of the film F is freely selectable in two different directions.

The exhaust unit 22 includes exhaust devices 22a, 22b such as a rotary pump or a dry pump. The exhaust unit 22 maintains a constant pressure by exhausting the gas inside the plasma-generating space where plasma is generated and by exhausting the gas inside the layer-forming space inside the container 12. The exhaust device 22a exhausts the reactive gas inside the below-mentioned plasma-generating space. The exhaust device 22b exhausts the gas inside the layer-forming space that includes the plasma-generating space below the plasma-generating electrode 16a.

The plasma-generating unit 16 includes: the plasma-generating electrode 16a; a grounding electrode 16b; a matching box 16c; and a high frequency electric power source 16d. The plasma-generating unit 16 generates a reactive substance that reacts with the layer-forming component adsorbed on the film F of the layer-forming gas. The space-partitioning wall 17 is disposed inside the layer-forming container 24 so as traverse the layer-forming container 24. The space-partitioning wall 17 is disposed between the feeding pathway of the film F and the plasma-generating electrode 16a. The plasma-generating electrode 16a in the film-forming container 12 is a plate-shaped electrode. The plasma-generating electrode 16a is disposed above the feeding pathway of the film F so as to face towards the feeding pathway along the feeding pathway of the film F. It is preferable that the plasma-generating electrode 16a be disposed in parallel to the feeding pathway. The plasma-generating electrode 16a generates plasma using the reactive gas inside the film-forming space as a result of the electric power supply received thereto. Specifically, electric supply lines are used to connect the plasma-generating electrode 16a to the high frequency electric power source 16d through a ceiling surface of the layer-forming container 12 via the matching box 16c. The high frequency electric power source 16d supplies a high frequency electric voltage to the plasma-generating electrode, e.g., a voltage of 13.56 MHz.

The grounding electrode 16b is disposed on a surface of the space-partitioning wall 17 so as to face the plasma-generating electrode 16a. In other words, the opposing surface that faces the plasma-generating electrode 16a of the space-partitioning wall 17 is composed of the grounding electrode 16b. The plasma P is generated using the reactive gas supplied to the space between the plasma-generating electrode 16a and the grounding electrode 16b, by applying high frequency voltage to the plasma-generating electrode 16a. In other words, the space between the plasma-generating electrode 16a and the grounding electrode 16b is the plasma-generating space.

The present embodiment can employ an inductively coupled plasma method or a conventional plasma-generating method, in addition to a capacitively coupled plasma method that generates plasma between electrodes, in which the plasma-generating electrode 16a and the grounding electrode 16b are disposed to face each other.

The electric supply lines that supply the high frequency electric power to the plasma-generating electrode 16a are connected to the matching box 16c outside the layer-forming container 24 via holes disposed in a ceiling surface of the layer-forming container 24. At such a time, the holes are sealed in the insulating body 16e. Moreover, an insulating body plate 16f made of a ceramic plate or the like is disposed in an outer periphery of the plasma-generating electrode 16a. Accordingly, the plasma-generating space is separated from a space above the plasma-generating electrode 16a.

The gas supply holes are disposed on one side wall (a side wall of a right side in FIG. 1) of the layer-forming container 12 that defines the plasma-forming space. The gas supply holes are connected to a gas supply pipe that is connected to the below-mentioned reactive gas source 20a, as illustrated in FIG. 1. The reactive gas is supplied inside the plasma-reacting space via the gas supply holes. In other words, the gas supply holes for supplying reactive gas inside the plasma-reacting space are disposed on a side wall of the layer-forming container 12. Moreover, the gas exhaust holes disposed on another side wall (a side wall of a left side in FIG. 1) of the layer-forming container 12 that defines the plasma-generating space. The gas exhaust holes are connected to the exhaust pipe that is connected to the exhaust device 22a, as illustrated in FIG. 1.

Figure 2:
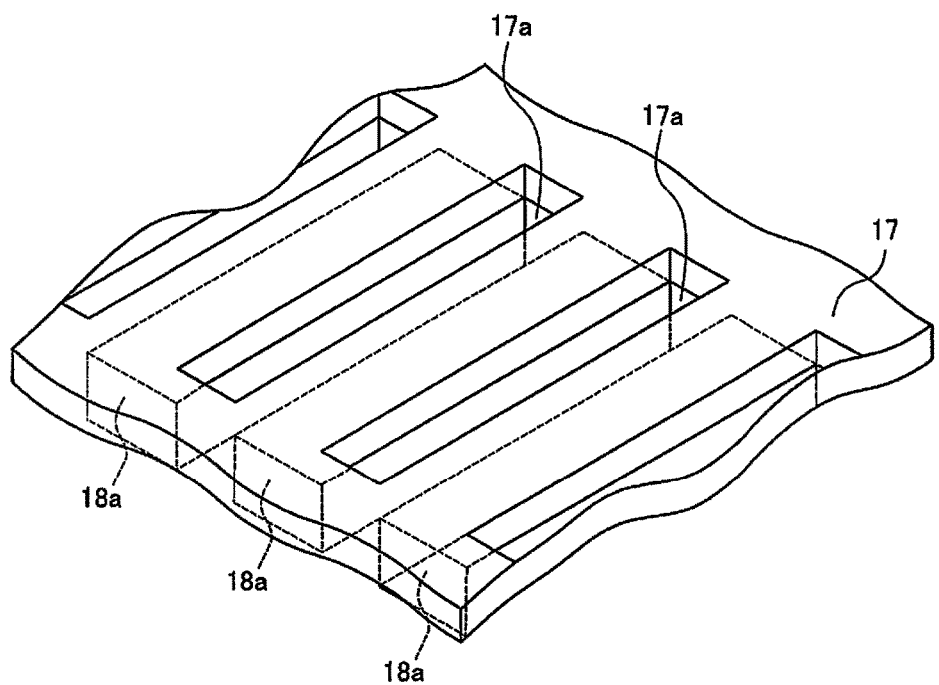
FIG. 2 illustrates a space-partitioning wall and a through hole, which is employed in the layer-forming device illustrated in FIG. 1.

FIG. 2 illustrates a position of a space-partitioning wall 17 and an injector 18a of an injector unit 18.

The space-partitioning wall 17 is formed from a plate-shaped insulting member. The space-partitioning wall 17 is disposed between the feeding pathway and the plasma-generating electrode 16a above the feeding pathway of the film F. The space-partitioning wall faces the plasma-generating electrode 16a. The space-partitioning wall forms the plasma-generating space between the plasma-generating electrode 16a and the space-partitioning wall. A surface of the space-partitioning wall 17 that faces the plasma-generating electrodes 16a is composed of the grounding electrode 16b. The slit-shaped through holes 17a are disposed at spaced intervals along the feeding direction of the film F in the space-partitioning wall 17. The through holes 17a communicate the plasma-generating space above the space-partitioning wall 17 and a space between the feeding pathway of the film F and the space-partitioning wall 17. It is preferable that the through holes 17a extend in a direction that is perpendicular to the feeding direction of the film F. A radical atom or a radical molecule generated from plasma or part of plasma passes through the through holes 17a, as described hereinafter.

The injector unit 18 is disposed between the space-partitioning wall 17 and the feeding pathway of the film F. The injector unit 18 includes a plurality of injectors 18a along the feeding pathway of the film F. Each of the plurality of injectors 18a is disposed so as to be sandwiched from both sides of the feeding direction by two through holes 17a that are adjacent each other in a feeding direction of the film F of the abovementioned through holes 17a. As mentioned hereinafter, the layer-forming gas supply opening is disposed in each of the plurality of injectors 18a, and the layer-forming gas is output and supplied to the film F from the layer-forming gas supply opening.

The plurality of injectors 18a form a row along the feeding pathway of the film F. The plurality of injectors 18a supply the layer-forming gas to the film F during feeding by outputting the layer-forming gas as described above, and a layer of layer-forming component is formed on the film F. The layer-forming component is chemically adsorbed onto the film F. In other words, a gas is selected such that the film F chemically adsorbs the layer-forming component. The plurality of injectors 18a are aligned at some intervals. Accordingly, in a case where a layer of the layer-forming component adsorbed onto the film F passes through a space between the adjacent injectors after the component being adsorbed on the film F, a radical atom, a radical molecule, or an ion of a reactive gas obtained from plasma P generated in the abovementioned plasma-generating space is downwardly supplied towards the film F via through holes 17a. In other words, the layer-forming device 10 is configured such that, the radical atom, the radical molecule, or the ion from each space between the adjacent injectors 18a is supplied to the layer of the layer-forming component formed on the film F.

A dummy injector 18b is disposed on both sides of the row of the plurality of injectors 18a. The dummy injector 18b lacks a layer-forming gas supply function. The dummy injector 18b is disposed such that the same space is formed between the dummy injector 18b and an adjacent injector 18a as that formed between the two adjacent injectors 18a. And the radical atom or the radical molecule is supplied to the film F from the space.

Accordingly, the dummy injector 18b that does not supply the layer-forming gas to the film F is disposed further on a downstream side of the feeding direction away from the furthest downstream injector positioned on a furthest downstream side of the feeding direction of the film F. It is preferable that the dummy injector 18b is disposed so as to be spaced at an interval away from the furthest downstream injector, such that the furthest downstream through hole positioned on a furthest downstream side of the feeding direction of the through holes 17a of the space-partitioning wall 17 is positioned between the dummy injector 18b and the furthest downstream injector. Accordingly, in a case where the feeding and the layer-forming of the film F is repeated by rotating the rotary rollers 14a, 14b in the opposite directions, it is preferable that the dummy injectors 18b are disposed on both sides of the plurality of injectors 18a aligned into a single row (as shown in FIG. 1), and also that the slit-shaped through holes 17a are disposed at a position in a feeding direction between the dummy injectors 18b and both sides of the plurality of injectors 18.

The gas supply holes are disposed in one of the side walls (a side wall of the right side of FIG. 1) of the layer-forming container 24 below the space-partitioning wall 17. The gas supply pipe connected to a below-mentioned purge gas source 20c is connected to the gas supply hole. The purge gas is a gas used to more efficiently exhaust a layer-forming gas, reactive radical, radical molecule, radical atom, or the like that are no longer needed.

In addition, the gas supply pipe that is connected to an inert gas source 20d and the gas supply pipe connected to a below-mentioned layer-forming gas source 20b is connected to each of the plurality of injectors 18a.

The gas supply unit 20 includes: the reactive source 20a; the layer-forming gas source 20b; the purge gas source 20c; the inert gas source 20d; and mass flow controllers 20e, 20f (refer to FIG. 3).

$O_2$, $O_3$, $H_2O$, $N_2O$, $N_2$, $NH_3$, or the like, may be employed as the reactive gas supplied by the reactive gas source 20a. A metallo-organic compound gas that includes trimethyl aluminum (TMA), tetrakis (ethylmethylamino) zirconium, tetrakis (ethylmethylamino) hafnium, or aminosilane may be employed as the layer-forming gas supplied from the layer-forming gas source 20b. An inert gas including a nitrogen gas, an argon gas, a neon gas, or a helium gas may be employed as the purge gas supplied by the purge gas source 20c. An inert gas including a nitrogen gas, an argon gas, a neon gas, or a helium gas may be employed as the inert gas supplied by the inert gas source 20d. The inert gas does not react with the reactive gas and the layer-forming gas, and also does not react with the thin layer that is formed.

In the layer-forming device 10, the plurality of injectors 18a are disposed so as to be spaced at intervals; and the fed film F receives a supply of the layer-forming gas from the plurality of injectors 18a when passing by each of the plurality of injectors 18a, such that the layer-forming component of the layer-forming gas is chemically adsorbed onto the film F in atomic layer unit. On the other hand, during the feeding of the film F, the reactive gas is supplied to the plasma-generating space, and plasma P is generated using the plasma-generating gas between the grounding electrode 16b and the plasma-generating electrode 16a to which the high frequency voltage applied. The plasma P or the radical atom, the radical molecule, or the ion generated from the plasma P passes through the through holes 17a of the space-partitioning wall 17, the through hole disposed in a space between the plurality of injectors 18a, and finally reaches the top of the film F. Accordingly, the thin layer is formed by reacting, with the above radical molecule, radical atom, or ion, the layer-forming component in atomic layer unit that is adsorbed onto the film F by the supply of the layer-forming gas from the plurality of injectors 18a. Since the plurality of injectors 18a and spaces between the adjacent injectors 18a are alternately disposed, the thin layer formed on the film F is gradually thickened during the feeding of the film F.

Accordingly, the film F for the layer-formation is fed by unwinding the roll of the film F (roll wound on rotary roller 14a or rotary roller 14b), and then the film F that has been subjected to a layer-forming process during feeding is wound to produce a roll of processed film (the first step). Furthermore, the film F is unwound from the roll of the processed film and is fed in order to thicken the thin layer on the film F, and then the film F that has been processed during feeding is wound to make a new roll of processed film (the second step). In addition, the target thickness of the formed layer on the film F can be obtained on the film by repeating the second step.

In the first step and the second step, a plurality of sets of sub-processes are conducted on the film F, each set of the sub-processes including:

a layer-forming component deposition, in which a layer of a layer-forming deposition component is formed on the film by supplying the layer-forming gas from the plurality of gas injectors 18a to the film F, and a reaction, in which the layer of the layer-forming component formed on the film is reacted with the supplied plasma or a radical generated from the plasma to the film F. In the above case, it is preferable that the final sub-process before the winding of the film F is the reactions rather than the above a layer-forming component deposition. Accordingly, an uppermost surface layer of the thin layer on the film F when winding the film F is a stable layer obtained after a layer-forming component is reacted with a neutral radical, or the like. As a result, it is possible for a stable thin layer to be retained even when the uppermost layer is brought into contact with a rear surface of the film F after the film F is wound as a roll.

In this way, the layer-forming device 10 can form the thin layer on the film F.

Description of the plurality of Injectors 18a

Figure 3A:
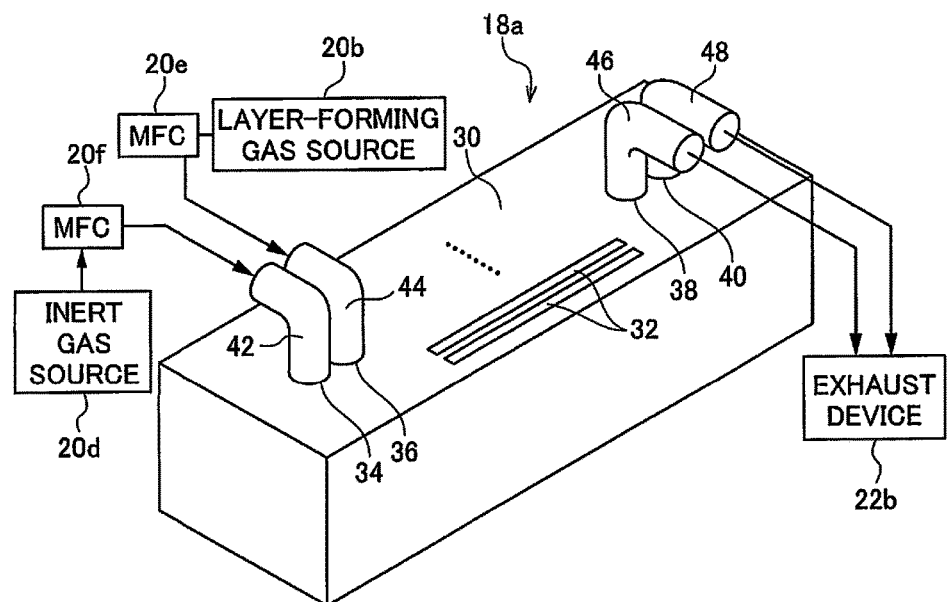
FIG. 3A illustrates a perspective view of a gas injector employed in the layer-forming device of the present embodiment.
Figure 3B:
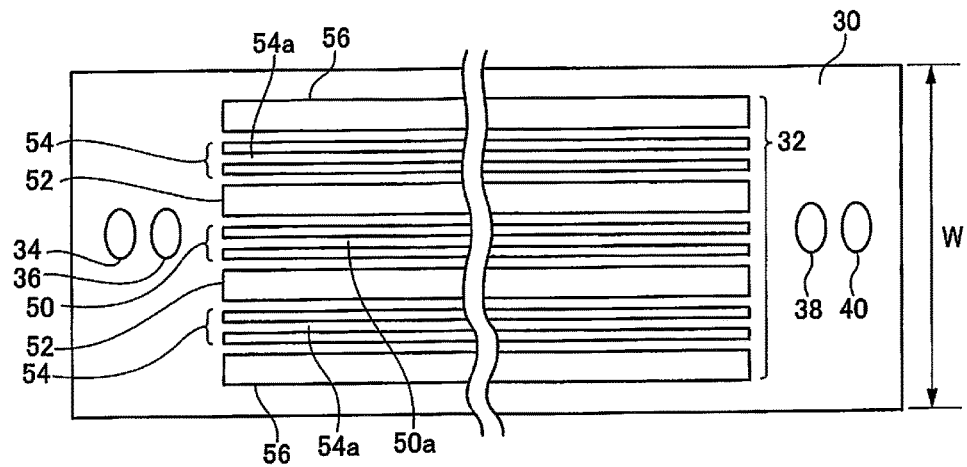
FIG. 3B illustrates a substrate opposing substrate of a gas injector illustrated in FIG. 3A.

FIG. 3A is schematic perspective view of the plurality of injectors 18a. FIG. 3A illustrate a substrate opposing surface 30 that faces the film F. In FIG. 3A, the substrate opposing surface is illustrated so as to face upwards. FIG. 3B illustrates a substrate opposing surface 30 of the plurality of injectors 18a.

The plurality of injectors 18a are disposed on a surface of the space-partitioning wall opposite to a surface that faces the plasma-generating electrode 16a, and the plurality of injectors 18a output and supply a layer-forming gas to the film F. However, the plurality of injectors 18a do not just simply supply a layer-forming gas, but rather the plurality of injectors 18a also suck the excess layer-forming gas that is not adsorbed onto the film F, and output an inert gas as a barrier gas so that the layer-forming gas is not dispersed from the injector 18a into the surrounding space between the adjacent injectors 18a.

The plurality of slit-shaped openings 32 that extend in a direction perpendicular to the feeding direction of the film F are disposed in the substrate opposing surface 30. A length of the plurality of openings 32 is substantially identical to that of a width of the film F. As illustrated in FIG. 3B, the plurality of openings 32 are disposed in the substrate opposing surface 30 that includes: a layer-forming gas supply opening 50; first gas exhaust openings 52, 52; inert gas supply openings 54, 54; and second gas exhaust openings 56, 56.

The layer-forming gas supply opening 50 is an opening for outputting and supplying the layer-forming gas towards the film F. The first gas exhaust openings 52, 52 are disposed on both sides of the feeding direction of film F with respect to the layer-forming gas supply opening 50, and the first gas exhaust openings 52, 52 are openings for suction of the excess gas existing above the film F. The inert gas supply openings 54, 54 are disposed on a far side of each of the first gas exhaust openings 52, 52 away from the layer-forming gas supply opening 50 in a feeding direction of the film F, and the inert gas supply openings 54, 54 supply the inert gas to the layer-forming component.

Members 50a, 54a that block a portion of an opening are disposed along a lengthwise direction of the plurality of slit-shaped openings, on an opening surface of the inert gas supply openings 54, 54 and the film-forming gas supply opening 50. The members 50a, 54a are for suppressing, as much as possible, injection velocity of the layer-forming gas and the inert gas from the layer-forming gas supply opening 50 and the inert gas supply openings 54, 54, and for supplying the layer-forming gas and the inert gas gradually to the surface of the film F. A width W of the injectors, 18a (see, FIG. 3B) is, e.g., 20 to 40 mm, and the opening width of each of the layer-forming gas supply opening 50, the first gas exhaust openings 52, 52, the inert gas supply openings 54, 54, and the second gas exhaust openings 56, 56 is, e.g., 1 to 5 mm.

Gas supply ports 34, 36 and gas exhaust ports 38, 40 form elliptically-shaped openings that are disposed on the substrate opposing surface 30, in addition to the plurality of openings 32, in order to supply and exhaust the gas.

As illustrated in FIG. 3A, the inert gas supply pipe 42 is connected to the gas supply port 34. The inert gas supply pipe 42 is connected to the inert gas source 20d via the mass flow controller 20f. The mass flow controller 20f controls a supply amount of the inert gas into the layer-forming space.

As illustrated in FIG. 3A, the layer-forming gas supply pipe 44 is connected to the gas supply port 36. The layer-forming gas supply pipe 44 is connected to the layer-forming gas source 20b via the mass flow controller 20e. The mass flow controller 20e controls the supply amount of the layer-forming gas into layer-forming space.

As illustrated in FIG. 3A, the exhaust pipes 46, 48 are each connected to the gas exhaust ports 38, 40. The exhaust pipes 46, 48 are connected to the exhaust device 22b.

In the present embodiment, the gas supply ports 34, 36, and the gas exhaust ports 38, 40 are not only limited to being disposed on the substrate opposing surface 30 of each injector 18a. The gas supply ports 34, 36 and the gas exhaust ports 38, 40 may be disposed on another surface of the injector 18a.

Although the second gas exhaust ports 56, 56 are included in the present embodiment, the second gas exhaust ports 56, 56 are not required. However, it is preferable that the second gas exhaust ports 56, 56 are included, from a point of view that a supply of a radical atom or radical molecule to a film F that is needed for the layer-forming is not avoided by reliably exhausting the inert gas and by streaming the inert gas in a space between the adjacent injectors 18a.

Figure 4B:
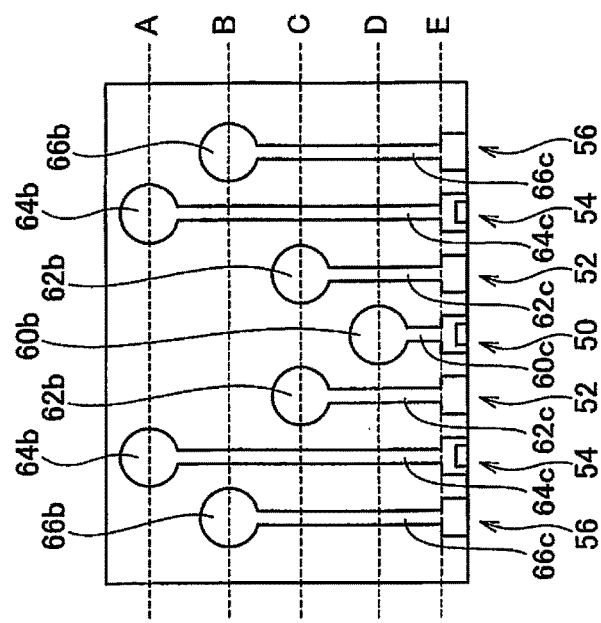
FIG. 4B illustrates a cross-sectional view of a gas injector along line X-X' in FIG. 4A.
Figure 4A:
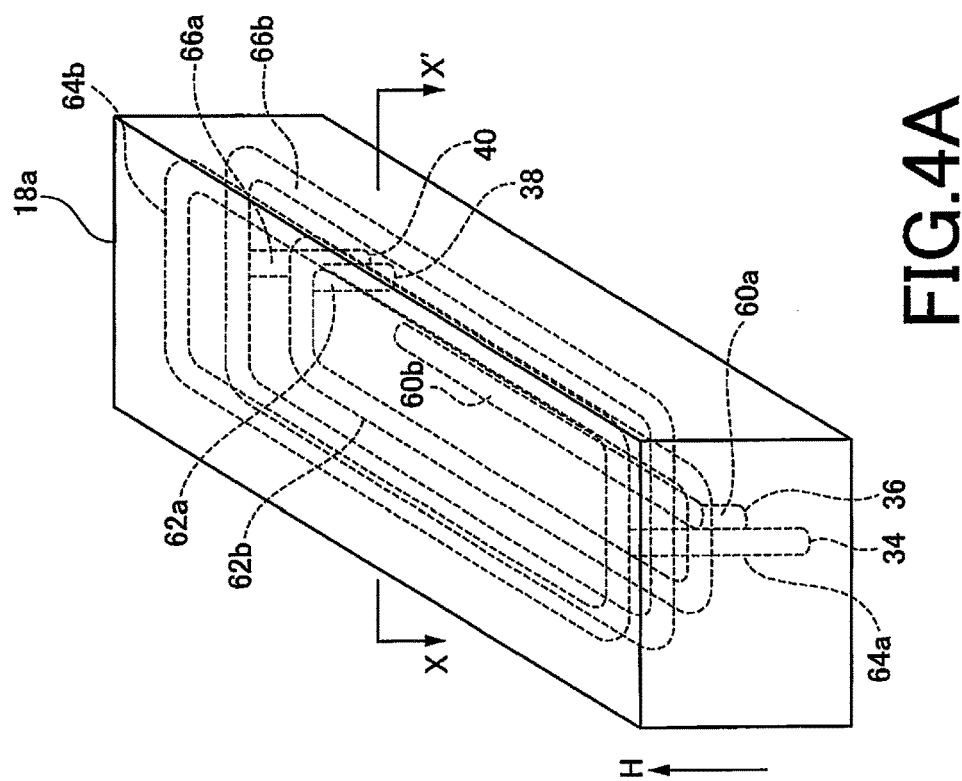
FIG. 4 A illustrates a gas flow passage of the layer-forming gas and the inert gas and an exhaust passage inside the gas injector that is employed in the layer-forming device of the present embodiment.

FIG. 4A illustrates a three-dimensional view of a gas flow passage of the layer-forming gas, a gas flow passage of the inert gas, and an exhaust passage in each injector 18a; and FIG. 4B illustrates a cross-sectional view of the injectors 18a along line X-X' in FIG. 4A.

As illustrated in FIG. 4A, a tubular layer-forming continuous hole that is disposed in the injector 18a extends from the gas supply port 36 that is connected to the layer-forming gas supply pipe 44. The layer-forming continuous hole includes: an upward part 60a that goes upward along a height direction H of the injector 18a; a storage part 60b that forms a long-narrow space that extends in lengthwise direction of the injector 18a in the injector 18a; and downward part 60c that goes downward along height direction H towards the layer-forming gas supply opening 50 from the storage part 60b (see, FIG. 4B).

Moreover, the exhaust connect hole, which extends from the exhaust port 38 that is connected to the exhaust pipe 46, is disposed in the injector 18a. The exhaust continuous hole includes: an upward part 62a that goes upward along the height direction H of the injector 18a; a ring part 62b that forms a ring shape in the injector 18a and that is connected to the upward part 62a; and a downward part 62c that goes downward along the height direction H towards each of the two gas exhaust openings 52, 52 from the ring part 62b (see, FIG. 4B).

In addition, the tubular inert gas continuous hole, which extends from the gas supply port 34 that is connected to the inert gas supply pipe 42, is disposed in the injector 18a. The inert gas continuous hole includes: an upward part 64a that goes upward along the height direction H of the injector 18a; a ring part 64b that forms a ring shape in the injector 18a and that is connected to the upward part 64a; and downward part 64c that goes downward along the height direction H towards the inert gas supply openings 54, 54 from the ring part 64b (see, FIG. 4B).

Further, the exhaust continuous hole, which extends from the exhaust port 40 that is connected to the exhaust pipe 48, is disposed in the injector 18a. The exhaust continuous hole includes: an upward part 66a that goes upward along the height direction H of the injector 18a; a ring part 66b that forms a ring shape in the injector 18a and that is connected to the upward part 66a; and downward part 66c that goes downward along the height direction H towards the second gas exhaust openings 56, 56 from the ring part 66b (see, FIG. 4B).

It is difficult to produce a plurality of intricately disposed continuous holes by hollowing-out one member. Thus, as illustrated in FIG. 4B, it is preferable that the structure is divided at a position of a ring part and a storage part along dividing line A-E.

As previously mentioned, while the layer-forming device 10 forms the plasma-generating space that generates plasma P by using the plasma-generating electrode 16a disposed in the layer-forming container 12, plasma P or a radical molecule, radical atom, or ion generated from the plasma P passes from the through hole 17a disposed at intervals into the space-partitioning wall 17, and is supplied to the film F from a space between the injectors 18a. The layer-forming gas from the injectors 18a is supplied to the film F and the layer-forming component is adsorbed. Accordingly, the layer-forming component that is formed by injecting the layer-forming gas from the injector 18a forms a thin layer by reacting with the radical molecule, the radical atom, or the ion. Because the layer-forming component only deposits in one atomic layer or a plurality of atomic layers as a result of a self-stop action effect, the thin layer is formable in atomic layer unit. Thus, the layer-forming device 10 includes a simplified structure that has a through hole and a space allowing plasma, a radical molecule, a radical atom, or an ion to pass through between an injector 18a and an adjacent injector 18a in the feeding direction of the film F. As such, the thickness of the thin layer is thickened every time the film F passes by a space between adjacent injectors 18a. Subsequently, the layer forming on the film F can be performed very efficiently.

Because the opposing surface of the space-partitioning wall 17 that faces the plasma-generating electrode 16a is composed of the grounding electrode, the plasma-generating space that generates plasma by a capacitively coupled plasma method is formed above the space-partitioning wall 17. Because the through holes 17a are disposed in the space-partitioning wall 17, the plasma, the radical atom, or the radical molecule may be easily supplied downward to the feeding passage of the film F from the space-partitioning wall 17. Accordingly, the radical atom or the radical molecule can be supplied to the film F via a simplified structure.

The plurality of injectors 18a are disposed on a surface of the space-partitioning wall opposite to a surface that faces the plasma-generating electrode. Subsequently, the layer-forming gas can be supplied to the film F using a simplified structure.

In addition, the dummy injector 18b that does not supply layer-forming gas to the film F is disposed further on the downstream side of the feeding direction away from a furthest downstream injector positioned on a furthest downstream side in a feeding direction of the film F. The dummy injector 18b is disposed so as to be spaced at an interval away from the furthest downstream injector, such that the furthest downstream through hole positioned on a furthest downstream side of the feeding direction of the through holes 17a of the space-partitioning wall 17 is positioned between the dummy injector 18b and the furthest downstream injector. Subsequently, a thin layer may be highly efficiently formed via ALD.

Because the rotary rollers 14a, 14b can rotate in different directions and the feeding direction of the film F can be freely selected, the feeding direction of the film F can be sequentially switched. Accordingly, the film F can move backward and forward several times, passing by the plurality of injectors 18a and regions between the plurality of injectors 18a until the thickness of the layer formed on the film F reaches a desired thickness. As a result, the thickness of the layer on the film F can be very efficiently achieved.

As previously mentioned, while the layer-forming device and the layer-forming method of the present disclosure have been described in detail, the abovementioned device and method should not be understood as being limited to the above embodiments. A person having ordinary skill in the art would understand that a number of variations or modifications may be made without departing from the scope of the present application.

The invention claimed is:

1. A layer-forming device that forms a thin layer in atomic layer unit using a layer-forming gas and a reactive gas, the layer forming device comprising:
   a layer-forming container;
   a feeding mechanism configured to feed a substrate for layer-forming inside the layer-forming container;
   a plasma-generating electrode disposed to face a feeding pathway of the substrate during feeding, the plasma-generating electrode configured to receive a supply of electric power to generate plasma using a reactive gas inside the layer-forming container;

a space-partitioning wall disposed between the feeding pathway of the substrate and the plasma-generating electrode, the space-partitioning wall forming a plasma-generating space between the plasma-generating electrode and the space-partitioning wall, the space-partitioning wall having a plurality of slit-shaped through holes for communicating the plasma-generating space and a space between the feeding pathway of the substrate and the space-partitioning wall, the through holes being disposed at intervals along a feeding direction of the substrate;

gas injectors, each of the gas injectors being disposed between the space-partitioning wall and the feeding pathway, and being sandwiched from both sides of a feeding direction by adjacent through holes of the plurality of through holes, each of the gas injectors including a layer-forming gas supply opening through which the layer-forming gas is supplied to the substrate and a pair of gas exhaust openings through which an excess gas including the supplied layer-forming gas above the substrate is sucked, the layer-forming gas supply opening being sandwiched between the pair of gas exhaust openings in the feeding direction, the layer-forming gas supply opening and the pair of the gas exhaust openings elongated in a lateral direction perpendicular to the feeding direction, having an identical length in the lateral direction respectively; and a pair of inert gas supply openings through which inert gas is supplied, and the layer-forming gas supply opening and the pair of gas exhaust openings sandwiched between the pair of the inert gas supply openings in the feeding direction, and a member that blocks a portion of each of the inert gas supply openings provided on each of the inert gas supply openings along a lateral direction perpendicular to the feeding direction, the member dividing each of the inert gas supply openings into two sections.

2. The layer-forming device according to claim 1, wherein an opposing surface of the space-partitioning wall that faces the plasma-generating electrode is composed of a grounding electrode.

3. The layer-forming device according to claim 2, wherein each of the gas injectors is disposed on a surface of the space-partitioning wall opposite to an opposing surface of the space-partitioning wall that faces the plasma-generating electrode.

4. The layer-forming device according to claim 3, wherein a gas supply hole for supplying the reactive gas inside the plasma-generating space is disposed in a side wall of the layer-forming container.

5. The layer-forming device according to claim 2, wherein a gas supply hole for supplying the reactive gas inside the plasma-generating space is disposed in a side wall of the layer-forming container.

6. The layer-forming device according to claim 2, wherein a dummy injector configured not to supply the layer-forming gas to the substrate is disposed further on a downstream side of the feeding direction than a furthest downstream gas injector positioned at a furthest downstream side of the feeding direction of the substrate, and the dummy injector is disposed so as to be spaced at an interval away from the furthest downstream gas injector, such that a furthest downstream through hole positioned on a furthest downstream side of the feeding direction of the plurality of through holes is positioned between the dummy injector and the furthest downstream injector.

7. The layer-forming device according to claim 1, wherein each of the gas injectors is disposed on a surface of the space-partitioning wall opposite to an opposing surface of the space-partitioning wall that faces the plasma-generating electrode.

8. The layer-forming device according to claim 7, wherein a gas supply hole for supplying the reactive gas inside the plasma-generating space is disposed in a side wall of the layer-forming container.

9. The layer-forming device according to claim 7, wherein a dummy injector configured not to supply the layer-forming gas to the substrate is disposed further on a downstream side of the feeding direction than a furthest downstream gas injector positioned at a furthest downstream side of the feeding direction of the substrate, and the dummy injector is disposed so as to be spaced at an interval away from the furthest downstream gas injector, such that a furthest downstream through hole positioned on a furthest downstream side of the feeding direction of the plurality of through holes is positioned between the dummy injector and the furthest downstream injector.

10. The layer-forming device according to claim 1, wherein a gas supply hole for supplying the reactive gas inside the plasma-generating space is disposed in a side wall of the layer-forming container.

11. The layer-forming device according to claim 10, wherein a dummy injector configured not to supply the layer-forming gas to the substrate is disposed further on a downstream side of the feeding direction than a furthest downstream gas injector positioned at a furthest downstream side of the feeding direction of the substrate, and the dummy injector is disposed so as to be spaced at an interval away from the furthest downstream gas injector, such that a furthest downstream through hole positioned on a furthest downstream side of the feeding direction of the plurality of through holes is positioned between the dummy injector and the furthest downstream injector.

12. The layer-forming device according to claim 1, wherein a dummy injector configured not to supply the layer-forming gas to the substrate is disposed further on a downstream side of the feeding direction than a furthest downstream gas injector positioned at a furthest downstream side of the feeding direction of the substrate, and the dummy injector is disposed so as to be spaced at an interval away from the furthest downstream gas injector, such that a furthest downstream through hole positioned on a furthest downstream side of the feeding direction of the plurality of through holes is positioned between the dummy injector and the furthest downstream injector.

13. The layer-forming device according to claim 1, wherein the feeding mechanism includes a pair of rotary rollers, the substrate is a long flexible film, and the film is wound onto one rotary roller before feeding.

14. The layer-forming device according to claim 13, wherein each rotary roller is configured to rotate in different directions.

15. The layer-forming device according to claim 1, wherein a member that blocks a portion of the layer-forming gas supply opening is provided on the layer-forming gas supply opening along a lateral direction perpendicular to the feeding direction, the member dividing the layer-forming gas supply opening being into two sections.

16. The layer-forming device according to claim 1, wherein each of the inert gas supply openings is elongated in the lateral direction perpendicular to the feeding direction, having a length in the lateral direction identical to the length of the layer-forming gas supply opening and the pair of the gas exhaust openings.

17. A layer-forming method conducted using a layer-forming device that includes:
  a layer-forming container,
  a feeding mechanism configured to feed a substrate for layer-forming inside the layer-forming container,
  a plasma-generating electrode disposed to face a feeding pathway of the substrate during feeding, the plasma-generating electrode configured to receive a supply of electric power to generate plasma using a reactive gas inside the layer-forming container,
  a space-partitioning wall disposed between the feeding pathway of the substrate and the plasma-generating electrode, the space-partitioning wall forming a plasma-generating space between the plasma-generating electrode and the space-partitioning wall, the space-partitioning wall having a plurality of slit-shaped through holes for communicating the plasma-generating space and a space between the feeding pathway of the substrate and the space-partitioning wall disposed at intervals along a feeding direction of the substrate, and
  gas injectors, each of the gas injectors being disposed between the space-partitioning wall and the feeding pathway, and being sandwiched from both sides of a feeding direction by adjacent through holes of the plurality of through holes, each of the gas injectors including a layer-forming gas supply opening through which the layer-forming gas is supplied to the substrate and a pair of gas exhaust openings through which an excess gas including the supplied layer-forming gas above the substrate is sucked, the layer-forming gas supply opening being sandwiched between the pair of gas exhaust openings in the feeding direction, the substrate being a film from a roll of film, the layer-forming gas supply opening and the pair of the gas exhaust openings elongated in a lateral direction perpendicular to the feeding direction, having an identical length in the lateral direction respectively, and a pair of inert gas supply openings through which inert gas is supplied, and the layer-forming gas supply opening and the pair of gas exhaust openings sandwiched between the pair of the inert gas supply openings in the feeding direction, and a member that blocks a portion of each of the inert gas supply openings provided on each of the inert gas supply openings along a lateral direction perpendicular to the feeding direction, the member dividing each of the inert gas supply openings into two sections,
the layer deposition method comprising:
producing a roll of processed film by unwinding the film from the roll of film, then feeding the film for layer-forming process, and winding the film processed during feeding; and
making a new roll of processed film by again unwinding the processed film from the roll of processed film, then feeding the processed film in order to increase a layer thickness on the processed film, and winding the processed film,
such that a target layer thickness is obtained by repeating the making operation.

18. The layer-forming method according to claim 17, wherein
  in the producing and the making, a plurality of sets of sub-processes are conducted to the film, each set of sub-processes including:
  a layer-forming component deposition, in which a layer of a layer-forming component is formed on the film by supplying the layer-forming gas from the gas injector to the film, and
  a reaction, in which the layer of the layer-forming component formed on the film is reacted with the plasma or a radical generated from the plasma supplied to the film, and wherein
  a final sub-process before winding the film is the reaction.

* * * * *